(12) United States Patent
Kandlikar

(10) Patent No.: US 11,143,466 B2
(45) Date of Patent: Oct. 12, 2021

(54) HEAT TRANSFER SYSTEM AND METHOD INCORPORATING TAPERED FLOW FIELD

(71) Applicant: Satish G. Kandlikar, Rochester, NY (US)

(72) Inventor: Satish G. Kandlikar, Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 16/018,927

(22) Filed: Jun. 26, 2018

(65) Prior Publication Data

US 2018/0306531 A1 Oct. 25, 2018

Related U.S. Application Data

(63) Continuation of application No. 14/210,616, filed on Mar. 14, 2014, now Pat. No. 10,018,430.

(Continued)

(51) Int. Cl.
*F28F 13/08* (2006.01)
*H01L 23/473* (2006.01)
(Continued)

(52) U.S. Cl.
CPC ............ *F28F 13/08* (2013.01); *H01L 23/473* (2013.01); *F28D 2021/0028* (2013.01);
(Continued)

(58) Field of Classification Search
CPC ... H01L 23/427; H01L 23/36; F28D 15/0266; F28D 15/0233; F28F 13/08; F28F 3/02; F28F 3/04; H05K 7/20; H05K 7/2039
See application file for complete search history.

(56) References Cited

U.S. PATENT DOCUMENTS

| 4,103,737 A | 8/1978 | Perkins |
| 4,825,941 A | 5/1989 | Hoshino et al. |

(Continued)

FOREIGN PATENT DOCUMENTS

| JP | 08-271185 | * 10/1996 |
| JP | 08271185 A | 10/1996 |
| WO | 2013066271 A1 | 5/2013 |

OTHER PUBLICATIONS

The effect of inlet constriction on bubble growth during flow boiling in microchannels; A. Mukherjee a,*, S.G. Kandlikar b; Available online Jun. 10, 2009; International Journal of Heat and Mass Transfer 52 (2009) 5204-5212.*

(Continued)

*Primary Examiner* — Gordon A Jones
(74) *Attorney, Agent, or Firm* — Bond Schoeneck & King, PLLC; Joseph M. Noto

(57) ABSTRACT

A heat transfer system including a fluid inlet; a fluid outlet; and a substrate in fluid communication with the fluid inlet and fluid outlet, the substrate including a heat exchange region having a heat transfer surface and a flow field adjacent the heat transfer surface, the flow field including a fluid flow area including an open region at the inlet, a heat transfer region in thermal communication with the heat exchange region, and a taper of the flow field cross-sectional area in the flow direction, wherein the flow field heat transfer region includes a plurality of spaced apart open enhancement features from 1 micron to 3 mm in size, and method for enhancing the heat transfer performance of an apparatus is disclosed.

6 Claims, 14 Drawing Sheets

Related U.S. Application Data

(60) Provisional application No. 61/782,458, filed on Mar. 14, 2013.

(51) Int. Cl.
   *F28F 3/02* (2006.01)
   *F28D 21/00* (2006.01)
   *H01L 23/367* (2006.01)
   *H01L 23/427* (2006.01)

(52) U.S. Cl.
   CPC .............. *F28F 3/02* (2013.01); *H01L 23/3672* (2013.01); *H01L 23/427* (2013.01); *H01L 2924/0002* (2013.01)

(56) References Cited

U.S. PATENT DOCUMENTS

| | | | |
|---|---|---|---|
| 4,884,630 A * | 12/1989 | Nelson | H01L 23/473 |
| | | | 165/170 |
| 4,953,634 A | 9/1990 | Nelson et al. | |
| 5,072,787 A | 12/1991 | Nakamichi | |
| 5,775,411 A | 7/1998 | Schuez et al. | |
| 6,807,059 B1 | 10/2004 | Dale | |
| 6,935,419 B2 | 8/2005 | Malone et al. | |
| 7,450,386 B2 * | 11/2008 | Silverstein | F28D 15/0266 |
| | | | 165/104.26 |
| 2006/0225867 A1 | 10/2006 | Park et al. | |
| 2007/0289718 A1 | 12/2007 | McCordic et al. | |
| 2009/0090490 A1 | 4/2009 | Yoshida et al. | |
| 2009/0236083 A1 | 9/2009 | Brand et al. | |
| 2010/0172091 A1 * | 7/2010 | Nishiura | H01L 23/3735 |
| | | | 361/689 |
| 2011/0247556 A1 * | 10/2011 | Raring | C23C 16/45519 |
| | | | 118/713 |
| 2012/0087088 A1 * | 4/2012 | Killion | F28F 3/12 |
| | | | 361/697 |
| 2014/0311725 A1 | 10/2014 | Balasubramanian et al. | |

OTHER PUBLICATIONS

JP 08-271185 Machine translation (Year: 1996).*

Balasubramanian, Lee, Teo and Chou, Flow Boiling Heat Transfer and Pressure Drop in Stepped Fin Microchannels, International Journal of Heat and Mass Transfer, vol. 67 (2013) pp. 234-252.

Miner, Phelan, Odom and Ortiz, Experimental Measurements of Critical Heat Flux in Expanding Microchannel Arrays, Journal of Heat Transfer (Oct. 2013) vol. 135, Issue 10, 8 pages.

Kandlikar, Satish G., Widger, Theodore, Kalani, Ankit and Mejia, Valentina, Enhanced Flow Boiling Over Open Microchannels with Uniform and Tapered Gap Manifolds, Journal of Heat Transfer, vol. 135 (Jun. 2013) pp. 1-9.

Tanda, Giovanni, Heat Transfer in Rectangular Channels with Transverse and V-Shaped Broken Ribs, International Journal of Heat and Mass Transfer, vol. 47 (2004) pp. 229-243.

Liu, Y., Cui, J., Jiang, Y.X., Li, W.Z., A Numerical Study on Heat Transfer Performance of Microchannels with Different Surface Microstructures, Applied Thermal Engineering, vol. 31 (2011) pp. 921-931.

Zhigang, Liu, Ning, Guan, and Chengwu, Zhang, Influence of Tip Clearance on Heat Transfer Efficiency in Micro-Cylinders-Group Heat Sink, Experimental Thermal and Fluid Science (2012) http://dx.doi.org/10.1016/i.expthermflusci.2012.11.021.

Tullius, J.F., Tullius, T.K., and Bayazitoglu, Y., Optimization of Short Micro Pin Fins in Minichannels, International Journal of Heat and Mass Transfer, vol. 55 (2012), pp. 3921-3932.

Reyes, M., Arias, J.R.,Velazquez, A., and Vega, J.M., Experimental Study of Heat Transfer and Pressure Drop in Micro-Channel Based Heat Sinks with Tip Clearance, Applied Thermal Engineering, vol. 31 (2011) pp. 887-893.

International Search Report and Written Opinion of corresponding application No. PCT/US2014/027246 dated Aug. 25, 2014.

* cited by examiner

HEAT TRANSFER SYSTEM AND METHOD INCORPORATING TAPERED FLOW FIELD

CROSS REFERENCE

This application claims the benefit of U.S. Provisional Patent Application Ser. No. 61/782,458, filed Mar. 14, 2013, the contents of which are hereby incorporated by reference in its entirety.

FIELD

The present invention relates to a heat transfer system and method incorporating a tapered flow field, and in particular to a heat transfer system and method incorporating a taper in the cross-sectional area of the flow field.

BACKGROUND

For the last several decades, air has been the preferred fluid for cooling electronics due to its availability, low cost (cooling fans), and reliable system operation. As chip power densities increased, liquid cooling systems have been introduced. Pioneering work revealed the potential for electronics cooling with microchannels. Liquid cooling in microchannels can be used to dissipate heat fluxes of approximately 1 kW/cm$^2$. However, temperature variation of the chip surface along the coolant stream and large pumping power required for this system are of concern. Flow boiling in microchannels was expected to provide effective cooling without these concerns; however, current research indicates that such high heat fluxes are not projected with current microchannel designs.

Heat transfer in a microchannel or a minichannel is efficient because of the small hydraulic diameters in these channels. Typical channel hydraulic diameters range from 200 micrometers to 3 mm for minichannels and below 200 micrometers for microchannels. The small hydraulic diameters also give rise to a high pressure drop. The increased pressure drop leads to higher pumping power, increased fluid pressure, and a steep pressure gradient in the channels along the flow direction.

Enhancing the channels with surface features, such as roughness, corrugations, turbulators, flow disruptors and fins provide further enhancement in heat transfer, but these features also increase the pressure drop.

For both single-phase flow and flow boiling applications, there is a need for heat transfer enhancement strategies that do not result in significant increase in the pressure drop. Alternatively, there is a need for heat transfer enhancement strategies that increase heat transfer for a given pressure drop or a given equipment size in single-phase flow and two-phase flow including flow boiling and flow condensation. In the case of a two-phase flow, there is additional need to provide a stable flow. In the case of flow boiling, high critical heat flux (CHF), high heat transfer coefficient, and low pressure drop are desired.

SUMMARY

In accordance with one aspect of the present invention, there is provided a heat transfer system including a fluid inlet; a fluid outlet; and a substrate in fluid communication with the fluid inlet and fluid outlet, the substrate includes a heat exchange region having a heat transfer surface and a flow field adjacent the heat transfer surface, the flow field includes a fluid flow area including an open region at the inlet, a heat transfer region in thermal communication with the heat exchange region, and a taper of the flow field cross-sectional area in the fluid flow direction, wherein the flow field heat transfer region includes a plurality of open enhancement features from about 1 micron to about 3 mm in height.

In accordance with another aspect of the present invention, there is provided a method for enhancing the heat transfer performance of an apparatus, including providing a heat transfer system including a fluid inlet; a fluid outlet; and a substrate in fluid communication with the fluid inlet and fluid outlet, the substrate includes a heat exchange region having a heat transfer surface and a flow field adjacent the heat transfer surface, the flow field includes a fluid flow area including an open region at the inlet, a heat transfer region in thermal communication with the heat exchange region, and a taper of the flow field cross-sectional area in the fluid flow direction, wherein the flow field heat transfer region includes a plurality of open enhancement features from about 1 micron to about 3 mm in height; and flowing fluid to the fluid inlet, through the flow field and out the fluid outlet in a manner to transfer heat in the heat exchange region.

These and other aspects of the present invention will become apparent upon a review of the following detailed description and the claims appended thereto.

DETAILED DESCRIPTION

Figure 1:
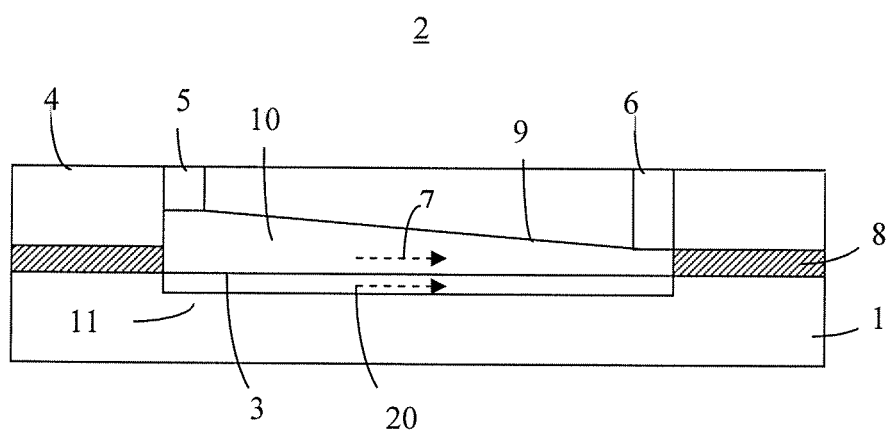
FIG. 1 is an embodiment showing a schematic cross-sectional view of the assembly along the length of a plurality of open microchannels in a flow field with negative taper having decreasing gap in the flow direction.

The present invention provides for overall enhanced heat transfer performance, preferably, for example, a significant reduction in the pressure drop at the same, higher or slightly lower heat transfer as compared to conventional macro and micro scale heat transfer systems and apparatus. The term fluid includes single-phase fluid (liquid or vapor) and two-phase fluid (liquid and vapor). The term vapor includes gas. The fluid substance in accordance with the present invention includes water, refrigerants, chemicals, petrochemicals, mixtures of two or more substances, air, cryogenic substances, and the like. The invention functions to provide an efficient heat transfer configuration to dissipate higher heat fluxes at lower wall temperatures, and/or increase critical heat flux in the case of flow boiling. In the case of single-phase flow, this invention serves to provide an efficient heat transfer configuration to transfer higher heat fluxes for a given pressure drop. The lower pressure drop in one embodiment also enables increasing the length of the heat exchanger thereby increasing the heat transfer surface area and the heat transfer rate. The invention can be used to reduce temperature non-uniformity by controlling the heat transfer coefficient and/or heat transfer surface area variation along the flow direction.

In accordance with an embodiment of the present invention, a heat transfer system includes a fluid inlet; a fluid outlet; and a substrate in fluid communication with the fluid inlet and fluid outlet, the substrate includes a heat exchange region having a heat transfer surface and a flow field adjacent the heat transfer surface, the flow field includes a fluid flow area including an open region at the inlet, a heat transfer region in thermal communication with the heat exchange region, and a taper of the flow field cross-sectional area in the fluid flow direction, wherein the flow field heat transfer region includes a plurality of open enhancement features from about 1 micron to about 3 mm in height, preferably from about 10 microns to about 1 mm in height.

In accordance with another embodiment of the present invention, a method for enhancing the heat transfer performance of an apparatus includes providing a heat transfer system including a fluid inlet; a fluid outlet; and a substrate in fluid communication with the fluid inlet and fluid outlet, the substrate includes a heat exchange region having a heat transfer surface and a flow field adjacent the heat transfer surface, the flow field includes a fluid flow area including an open region at the inlet, a heat transfer region in thermal communication with the heat exchange region, and a taper of the flow field cross-sectional area in the fluid flow direction, wherein the flow field heat transfer region includes a plurality of open enhancement features from about 1 micron to about 3 mm in height; and flowing fluid to the fluid inlet, through the flow field and out the fluid outlet in a manner to transfer heat in the heat exchange region.

In an embodiment of the present invention, the heat transfer system includes a single inlet; a single outlet; multiple fluid inlets; multiple fluid outlets; or combination thereof, in fluid communication with the substrate.

The invention provides a flow field incorporating a taper. Taper is defined as a change in the cross-sectional area of the flow field in the fluid flow direction. An overall increase from inlet to outlet of the cross-sectional area of the flow field in the fluid flow direction is defined as positive taper. An overall decrease from inlet to outlet of the cross-sectional area of the flow field in the fluid flow direction is defined as negative taper. The taper can be uniform, non-uniform, continuous, variable, step-wise, and combinations thereof. The taper can incorporate regions of non-taper, positive, negative, or uniform taper, and any combinations thereof. For example, taper can include a region of taper, followed by a region or other regions of different taper or region or other regions of no taper. The taper can be designed to meet desired thermal characteristics. In an embodiment, the flow field cross-sectional area is considered tapered when at least some region of the flow field is tapered in the flow direction.

In accordance with an embodiment of the present invention, the flow field includes a fluid flow area including an open region at the inlet, a heat transfer region in thermal communication with the heat exchange region, and a taper of the flow field cross-sectional area in the fluid flow direction. In flow boiling, the flow field incorporates an open region at the inlet and a positive taper for providing an escape path for vapor in two-phase flow while promoting liquid flow toward the heat transfer surface during boiling. The increasing area in the flow direction reduces the accelerational pressure drop during boiling and aids in reducing the overall pressure drop. The invention will make a dramatic impact in heat exchangers, generally and high performance microscale heat exchangers, such as in the field of electronics cooling, in particular. In this flow boiling embodiment, the flow field cross-sectional area is increased in the direction of flow by providing a positive taper from the fluid inlet to the fluid outlet and an open region throughout the flow field. In single-phase flow and in condensation two-phase flow the flow field incorporates an open region at the inlet and the cross-sectional area is decreased in the direction of flow by providing a negative taper from the fluid inlet to the fluid outlet. In single-phase flow and in condensation two-phase flow the flow field may incorporate a closed region in the flow field downstream from the open region, for example, at the outlet. In single-phase and two-phase flow, the taper of the flow field area can be coupled with other enhancement techniques, as desired. In these applications, the taper can be configured as positive, negative, uniform, non-uniform, stepped and similar regions individually or in any combination to provide desired heat transfer and pressure drop performance.

The phrase flow field is used to designate a region that fluid flows through to affect heat transfer in the system. An open region of the flow field is a region of the flow field containing a gap above the enhancement features wherein the fluid flow is mixed throughout the open region. For example, a flow field containing a plurality of open microchannels throughout is considered a mixed flow field since the fluid flow is mixed throughout the open region. For example, a plurality of closed microchannels at the inlet region of a flow field is considered an unmixed flow field region since the fluid flow is unmixed throughout the closed region. The flow field in accordance with the present invention includes a heat transfer region containing a plurality of enhancement features and an open region incorporating a gap above the enhancement features. An individual channel with a heat transfer region and an open region above the enhancement features is considered a mixed flow field. The flow field heat transfer region is a region of the flow field which exchanges heat with heat transfer surfaces of the substrate. An open enhancement feature is an enhancement feature having a gap above the enhancement feature wherein the fluid flow over the heat transfer surface of the substrate is in communication with the fluid flow in the gap. In an embodiment, the flow field contains enhancement features, including, but not limited to, pin fins, microchannels, uniform roughness and structured roughness elements, turbulators, vortex generators, non-uniform roughness, projections, pins, micro fins, nanowires, channels, porous surfaces, microstructures, nanostructures, turbulators, vortex generators, and the like, and combinations thereof.

The term "microchannel" is used to indicate microchannels and minichannels. The microchannel can be straight or wavy, may incorporate enhancement features, such as uniform or structured roughness, or secondary features including, but not limited to nanowires, nanostructures, porous matrix, or other features and combinations thereof. The microchannel and other features may be created by any fabrication process, including, but not limited to, etching, ablating, sintering, machining, stamping, embossing, electroplating, laser machining, water jet, plastic deformation technique, and the like. The term microchannel also includes enhancement features, including, but not limited to, pin fins of any shapes, offset-strip fins, delta wings and flow turbulators.

Taper can be effectively implemented, for example, by making fins shorter or longer along the flow length. To make fabrication easier, the fin height may be changed in a stepwise fashion. Alternatively, the cover may be fabricated with a taper resulting in a change in the flow area. The varying roughness, geometry, and/or density of enhancement features, such as fins, two-dimensional and three-dimensional roughness structures can be incorporated to yield similar thermohydraulic effect as taper.

In accordance with an embodiment of the present invention, the flow field area is changed without changing the width at the prime surface of the heat exchange region alone. On a heat exchanger surface composed of fins, the fins are conceptualized as being placed on the base surface. The heat transfer area of the base surface that is in communication with the fluid is referred to as prime area and the surface area of the fins is referred to as the fin area. The total heat exchange surface area is the sum of the prime and fin surface areas. In the case of nanowires, nanostructures, and some microstructures, the area enhancement of these features is not considered separately; but reflected in the enhancement in the heat transfer coefficient.

Changing the flow field cross-sectional area in the flow direction without substantially changing the width at the prime surface of the heat exchange region alone can be accomplished according to one embodiment, by changing the height of the channel without substantially changing the width of the channel, wherein for example a channel represents the flow field and the base of the channel represents the prime surface of the heat transfer region. So, for example, in a heat exchange apparatus wherein the fluid flow field is represented by a series of adjacent channels, the flow field cross-sectional area can be changed by changing the height of the channels in the desired manner without substantially changing the width of the substrate that represents the prime surface of the heat exchange region. Further, the flow field cross-sectional area can be changed in accordance with another embodiment by changing the height of the channels in the desired manner in combination with changing the width of the substrate that represents the prime surface of the heat exchange region. In other embodiments this can be accomplished by other manners.

In a heat exchanger composed of multiple parallel microchannels, the prime surface of the heat exchange region associated with a channel may be identified as the area associated with the base of the channel. At any flow cross-section, representing a cross-section normal to the overall flow direction, the width of the microchannel at the base is considered to be the prime surface of the heat exchange region. For a microchannel with constant flow cross-sectional shape along the flow length, the width of the flow cross-section at the prime surface remains constant along the flow length. Changing the flow field cross-sectional area, by changing the width of the cross-section at the prime area along the flow direction, while the height and shape of the fins remain essentially unchanged, is considered changing the width at the prime surface of the heat exchange region alone.

In contrast, as an example, the following different ways describe how the flow field cross-sectional area can be changed without changing the width of the flow cross-section at the prime surface alone. The change in the flow cross-sectional area along the flow length can be accomplished by changing the width of the cross-section in different region or regions other than at the prime surface. For example, a rectangular flow cross-section may change to a trapezoidal flow cross-section, while the width of the flow cross-section at the prime surface may remain constant, as the width at the other opposite side of the rectangle is changed. The flow cross-sectional area may alternatively be changed by changing the flow cross-sectional area through changing the height of the flow cross-section.

In the case of a pin fin, the flow cross-sectional area may be changed in the flow direction by changing the fin density along the flow direction. This represents changing the flow cross-sectional area by changing the width of the flow cross-section at the prime surface alone. Adding a gap above the fins to provide a gap whose flow cross-sectional area (of the gap) changes along the flow direction provides another way to change the flow cross-sectional area of the flow field. This arrangement with the gap may be accomplished with uniform fin density or varying fin density along the flow length. This arrangement also represents an example of how the flow cross-sectional area can be changed without changing the width of the flow cross-section at the prime surface alone.

An embodiment of this invention provides at least three different methods in which the flow resistance and heat transfer characteristics can be changed along the flow direction. One way is to change the flow cross-sectional area in the flow direction, without changing the width of the flow cross-section at the prime surface of the heat exchange region alone. A second way is to change the geometry, density or the size and shape of the surface and/or enhancement features along the flow direction, without changing the width of the flow cross-section at the prime surface alone. A third way is a combination of the previous two ways described earlier in this paragraph.

As an example of the second method, the flow resistance and the heat transfer characteristics can be changed by changing the surface roughness of the surfaces encountered by the fluid along the flow length. This may be accomplished by changing the pitch of the roughness structures along the flow length. As another example of the second method, the density of the flow turbulators placed on the surfaces encountered by the fluid flow may be changed along the flow direction.

In accordance with an embodiment of the present invention critical heat fluxes are obtained above 400 W/cm$^2$, preferably above 500 W/cm$^2$, more preferably above 600 W/cm$^2$, including 260 W/cm$^2$ at 3 kPa, 350 W/cm$^2$ at 10 kPa, and 650 W/cm$^2$ at 6.5 kPa, using water as the fluid.

In accordance with an embodiment of the present invention enhancement feature height ranges include about 1μ-3 mm, 1μ-1000μ, 10μ-500μ, and 160μ-400μ.

In accordance with an embodiment of the present invention pressure drops of less than about 10 kPa over 10 mm flow length are achieved for dissipating from about 400-600 W/cm$^2$ heat flux from a 10 mm×10 mm chip surface.

The details and workings of embodiments in accordance with the invention are schematically shown in the following Figures. FIG. 1 is a schematic representation of a substrate 1, in this example a microchannel chip system 2 on which the microchannel enhancement features of the substrate conduit are incorporated. Although the substrate 1 is shown as planar, it may be of any other shape, including cylindrical or of any other configuration. The microchannels 3 may be of any cross-section, including, but not limited to, rectangular, square, triangular, trapezoidal, and combinations of these and other possible configurations that includes the description given in the above paragraphs. These channels are generally parallel, but may deviate from being parallel, and the cross-section may be non-uniform along the flow length. The channels may be along the fluid flow direction or at any other angle, including 90 degrees. The microchannel region can also be replaced by one or more other enhancement features such as pin fins, 2d and 3d roughness features, uniform or structured roughness features, turbulators, vortex generators, flow modifiers, nanowires, nanostructures, and the like, and combinations thereof.

FIG. 1 shows a schematic of a cover block 4 with inlet 5 and outlet 6 ports. These ports serve to provide inlet and outlet passages for the fluid flow in the open region 7 and flow in the heat transfer region 20 of the flow field 10. The orientation and the configuration of the port passages within the cover block may be different so as to provide the inlet and outlet, or multiple inlets and/or outlets, from different faces of the cover block. These ports may be made of more complex flow passages rather than the straight with uniform cross section as shown in FIG. 1. The ports may be incorporated elsewhere, including the substrate 1 or the heat transfer surface. A gasket 8 can be used between the cover block 4 and the substrate 1 as shown in this embodiment.

FIG. 1 is a schematic representation of an embodiment of the system showing a microchannel chip system 2 with a negative taper 9 of flow field 10 over the microchannels 3. The open region 7 is formed in this example by the gasket 8 and the cover block 4. Fluid is supplied through the inlet 5 port, travels through the heat transfer region 20, shown as a plurality of open microchannels 3, and the tapered flow field open region 7 and is removed through the outlet 6 in the cover block 4. Heat is transferred between the heat transfer surface 11 of the substrate 1, in this example the surface of the open microchannels 3, and the fluid. The tapered flow field open region 7 may be created by other manners, such as recessing the cover block over the microchannel region, or changing the height of the microchannel fins, or the height of other enhancement features. The gasket 8 in this embodiment provides a seal and a gap, however these functions could be achieved by other alternative manners.

FIG. 1 shows one of the embodiments of providing a flow field 10 with open microchannels 3. This configuration may be achieved by other manners, such as, but not limited to, a cover block with a recess over the microchannel region, use of an o-ring for sealing purposes, or joining the microchannel chip and the cover plate with glue, anodic bonding, mechanical fixing, soldering, welding, or the like.

In an embodiment surface features embedded on the surface of the cover plate 4 can form the tapered open region of the flow field 7. A smoothly varying 2-dimensional profile is an example. The profile is preferably a smoothly varying sinusoidal profile, although any 2-dimensional or three-dimensional surface features may be incorporated, including, but not limited to, turbulators, vortex generators, and other enhancement features and techniques.

The fluid flow is affected by the surface feature in the vicinity of the open region over the microchannels. The change in the fluid flow direction disturbs the flow over the microchannel surfaces causing heat transfer enhancement. The shape of the surface feature, the difference between the minimum and maximum open region along the flow direction, the minimum open region, the microchannel width and depth, and microchannel fin width are parameters that can be optimized for given operating conditions and a desired performance. Similarly, the enhancement feature parameters in other enhancement techniques may be varied for improved performance. For the 2-dimensional roughness features the ratio of the pitch to the difference between the minimum and maximum flow field height is a parameter that can affect the pressure drop and heat transfer performance.

Roughness features in accordance with the invention include plain microchannels with fins which generate an enhancement profile on the sidewalls of the microchannels. The fluid flow through the open microchannel region encounters varying cross-sectional area along the flow length. This causes an enhancement in the heat transfer. Other surface features may be incorporated on the side walls and/or the bottom walls and the surface of the fin region exposed to the flow field open region. These surface features may be used alone, or some combination thereof, or along with the surface features incorporated on the cover block.

In single-phase flow, a negative taper 9 of the flow field 10 cross-sectional area in the direction of fluid flow can be seen in FIG. 1, which shows one embodiment of the present invention having an open region which provides additional fluid flow cross-sectional area for the fluid flow. This additional area reduces the pressure drop as compared to the flow field without any open region. Higher fluid flow rates can be introduced for a given allowable pressure drop as compared to microchannels not having additional area provided by the open region. The advantage of additional fluid flow in the case of single-phase flow is that the temperature rise of the fluid, due to the heat transfer from the microchannels to the fluid, is lowered. This allows for larger heat transfer to occur for a given allowable fluid temperature rise. Conversely, the fluid temperature rise will be lower for a given heat transfer rate with the higher fluid flow rate, and thus the maximum wall temperature of the microchannel surface will also be lower.

For a fluid mass flow rate of m kg/s, the fluid temperature rise in the case of single-phase flow from the inlet $T_{f,in}$ to outlet $T_{f,out}$ depends on the heat transfer rate to the fluid, neglecting losses $$q = mC_p(T_{f,out} - T_{f,in}) \quad (1)$$

where $C_p$ is the specific heat of the fluid, taken at the average fluid temperature. Increasing m allows for a larger heat removal by the fluid for the same fluid temperature rise. The corresponding pressure drop is given by $$\Delta P = \frac{2f_{ave}Lm^2}{\rho A_c^2 D_h} \quad (2)$$

where $f_{ave}$ is the average friction factor, L is the flow length, $\rho$ is the fluid density, $A_c$ is the flow cross-sectional area, and $D_h$ is the hydraulic diameter of the flow channel. By increasing the flow area and/or hydraulic diameter, the pressure drop goes down. The friction factor also depends on the flow rate. For laminar flow, the fully developed friction factor $f_D$ is given by $$f_D = \frac{64 A_t \mu}{m D_h} \quad (3)$$

where $\mu$ is the viscosity of the fluid. The average friction factor $f_{ave}$ is higher than $f_D$ due to entrance region effects. An estimate of the pressure drop can obtained by neglecting the entrance region effects, and combining Equations (2) and (3). It is seen that an increase in the flow area substantially decreases the pressure drop.

The heat transfer rate is given by the following heat transfer equation.

$$q = h A_s (T_s - T_f) \quad (4)$$

where h is the heat transfer coefficient, $A_s$ is the heat transfer area, and $T_s$ and $T_f$ are the surface and fluid temperatures. Since the temperatures vary along the flow length, an integration is preferred. Nevertheless, it is clear that increasing h and $A_s$ lead to an increased heat transfer rate. In the case of finned surfaces, fin efficiency may be included in evaluating the heat transfer from the fin surfaces.

In the open microchannel geometry having an open region, the heat transfer coefficient over the heated surface is high due to the presence of the microchannels or other enhancement features in the flow field. The presence of an open region provides an extra area for fluid flow, thereby reducing the pressure drop for a given flow rate as compared to the flow through the microchannel area (closed microchannel) only, and offers a very attractive solution for heat transfer from the surface under a given pressure drop constraint. In addition, during flow boiling, the acceleration pressure drop decreases because of the increasing area provided by the positive taper and greatly reduces the total pressure drop. Surface features can be incorporated on one or more of the surfaces of the microchannels and the cover block. These surfaces are provided to enhance the heat transfer performance through a higher heat transfer rate for a given temperature difference.

In single-phase flow the flow field cross-sectional area is reduced in the direction of fluid flow by the negative taper of the flow field area. This can be implemented in an embodiment which provides a tapered cover block over the flow field and a reduction of the flow field cross-sectional area in the direction of fluid flow. The heat transfer coefficient in a uniform flow field arrangement is constant along the flow length, barring for the effects due to fluid property changes with temperature and entrance region effects. For the case where heat flux is more or less uniform, this leads to a temperature variation of the substrate along the flow direction. To account for this, in a preferred embodiment, a negative tapered 9 flow field 10 is introduced as shown in FIG. 1. The gap is higher at the fluid entrance and decreases along the flow length. This reduces the flow field cross-sectional area and causes the heat transfer coefficient to increase along the flow length. The wall temperature $T_w$ at any section may be expressed as a function of the local heat flux q" and the local fluid temperature $T_f$ $$T_W = T_f + \frac{q''}{h} \quad (5)$$

since $T_f$ increases along the flow length, an increase in h will be able to offset by reducing the second term in Equation (5). This is accomplished by providing the negative taper as shown in FIG. 1. The flow field cross-sectional area reduces from inlet 5 to outlet 6, thereby increasing the heat transfer coefficient. The increase in pressure drop due to the positive taper 12 is adjusted by changing the taper angle or the effective taper variation and the initial gap at the inlet section.

Similar effect can be accomplished by another embodiment having a roughness feature on the cover block with an increasing roughness along the flow length on the cover block, effectively resulting in a taper of the flow field area. As the roughness increases, the heat transfer coefficient increases along the flow length and the wall temperature will tend to be more uniform along the flow length as given by Equation 1. The change in the roughness or other feature density provides a similar effect as a taper.

There are other techniques that can be implemented to provide an increasing h along the flow direction, including, but not limited to, increasing density of surface features, such as microchannels, fins, turbulators and flow modifiers along the flow length, which are effectively another form of taper.

FIG. 1 shows an embodiment in which the flow field cross-sectional area along the flow length varies continuously due to continuously varying negative taper 9 in the height of the microchannel fins forming the channel walls, although other techniques could be implemented to achieve a similar effect. Flow channels are created by covering the top surface of the microchannel chip with a cover, although different configurations could be implemented to achieve a similar effect. Further, this continuous varying of the taper can be implemented in a positive taper 12 in the cross-sectional area along the flow direction as shown in FIG. 2.

During flow boiling in microchannels there are four main issues that are encountered. (1) High pressure drop, (2) Flow instability, (3) Low Critical Heat Flux (CHF), and (4) Low heat transfer coefficient. A microchannel configuration embodiment with cover block 4 employing flow boiling is shown in FIG. 2. The flow field 10 open region 7 provides the extra space needed as the liquid evaporates into vapor, whose specific volume is higher than the liquid. The increase in the flow area reduces the pressure drop as compared to the flow in microchannels without the open region. The pressure drop reduction also comes from the reduction in the acceleration pressure drop due to increasing area along the flow direction. The arrangement reduces the severity of the flow instabilities. The liquid flows preferentially through the microchannels due to higher resistance to vapor flow, and/or capillary and/or gravitational forces and supplies the liquid over the heat transfer surfaces. The vapor flows preferentially through the gap. The separate pathways provided in the microchannels with open flow field configuration helps in increasing the CHF. The flow configuration also helps in improving the heat transfer coefficient.

Figure 2:
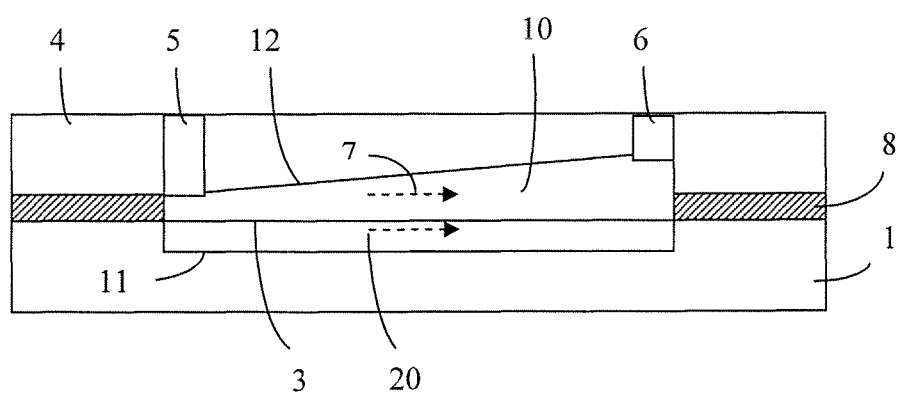
FIG. 2 is an embodiment showing a schematic cross-sectional view of the assembly along the length of a plurality of open microchannels in a flow field with positive taper having increasing gap in the flow direction.

FIG. 2 shows flow boiling with a positive tapered flow field configuration. The flow field cross-sectional area is tapered from the fluid outlet to the fluid inlet. The flow area increases in the fluid flow direction. This configuration reduces the backflow caused during the boiling process, and improves the flow stability. There may be other types of instability present in the system, such as those due to the inlet volume compressibility effects, and a valve may be used prior to the inlet to avoid those types of instabilities. Since the flow area is getting larger in the flow direction, the pressure drop is smaller for a given flow rate and for a given heat removal rate as compared to flow inside closed microchannels. The heat transfer performance of the tapered flow field embodiment is improved and pressure drop is reduced as compared to an arrangement utilizing a uniform gap having the gap set as the minimum gap in the tapered gap embodiment.

In another embodiment the flow cross-sectional area along the flow length varies in a step-wise or non-continuous fashion due to step-wise varying taper in the heights of the microchannel fins forming the channel walls, although different configurations could be implemented to achieve a similar effect. Flow channels are created by covering the top surface of the open microchannels and the gap with a cover, although different configurations could be implemented to achieve a similar effect. The step-wise varying taper could be reversed to realize a reverse taper in the cross-sectional area along the flow direction.

Figure 3:
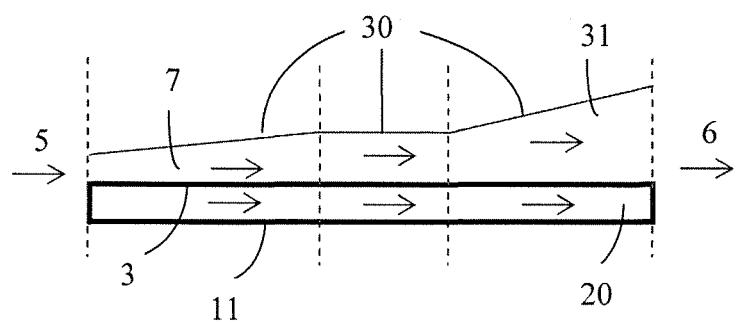
FIG. 3 is a schematic showing an embodiment of positive taper.

FIG. 3 shows the positive taper 30 differing in several regions of the flow field 31. It is possible to have positive taper or negative taper or a region with uniform gap in different regions in any combination with other regions of taper. Further, a tapered flow field includes a flow field where there would be at least one region where there is taper.

Figure 4:
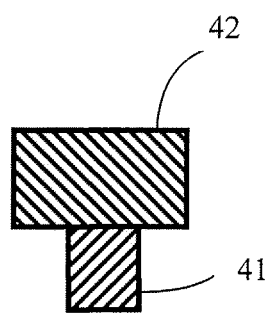
FIG. 4 is a schematic representation of flow cross-sectional area in the heat transfer region and the open region of the flow field.

A flow field can incorporate separate or interconnected flow passages through which a fluid medium flows while exchanging heat with the heat transfer surfaces. FIG. 4 shows flow areas associated with an embodiment in accordance with this invention. In the present invention, the flow cross-sectional area changes due to taper. $A_{FF,HTR}$ 41 represents the flow cross-sectional area in the flow field in the heat transfer region. Due to the presence of gap, the additional flow cross-sectional area at any cross-section is $A_{FF,Gap}$ 42. The total flow cross-sectional area at any cross-section is $A_{FF,HTR}$ plus $A_{FF,Gap}$. Preferred dimensions in accordance with an embodiment of the invention are as follows. The ratio of the maximum fluid flow cross-sectional area to the minimum fluid flow cross-sectional area, $(A_{FF,Gap}+A_{FF,HTR})/A_{FF,HTR}$ is preferably in the range of from about 1.0001 to about 1000, more preferably from about 1.001 to about 100, and most preferably from about 1.01 to about 10.

The heated perimeter may vary along the flow length due to the taper. The minimum heated perimeter is $P_{min}$ and the maximum heated perimeter is $P_{max}$.

In accordance with one embodiment of the present invention, the pressure drop in the heat transfer system of the flow field is allowed to be reduced due to the introduction of the cover gap. Alternatively, for a given pressure drop limit, the fluid flow rate through the heat transfer system is increased. The heat transfer performance in the system can be affected in two ways. The heat transfer coefficient may be reduced due to the addition of increased flow area in the cover gap. This decrease is more than offset by the heat transfer performance, as measured by the total heat transfer rate, or in terms of heat transfer rate for a given pressure drop limit, due to the reduction in the pressure drop caused by the addition of the increased flow area in the cover gap.

As the flow cross-sectional area decreases due to the negative taper, the heat transfer coefficient may increase in the case of the single-phase flow at the given location. By adjusting the change in the heat transfer coefficient coupled with the heat transfer area changes and the fluid temperature variation in the flow direction, the substrate temperature could be controlled to remain substantially uniform, or to change in a certain desired fashion. The design results in a lower pressure drop as compared to a heat exchanger without a taper that is designed to meet the same substrate temperature limit.

As the flow cross-sectional area increases due to the positive taper, the heat transfer coefficient may increase in the case of the flow boiling at the given location, the flow becomes stable and the pressure drop reduces as compared to the configuration having a uniform cross-sectional area set at the minimum area in the case of the positive taper configuration. In the case where the cross-sectional area is maintained uniform at the highest value in the case of the positive tapered configuration, although the pressure drop is lower in the case of the uniform cross-sectional channel, the heat transfer performance is also lower and/or the flow is less stable. The actual taper and the flow cross-sectional area can be adjusted to yield stable operation and the desired heat transfer performance for a given pressure drop limit.

Figure 5A:
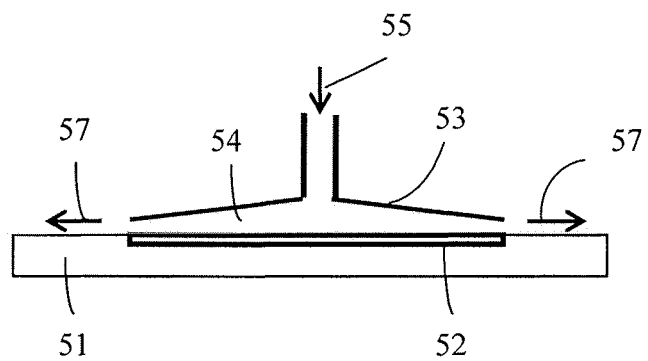
FIGS. 5A and 5B are schematics of an embodiment showing a radially expanding flow with a radial tapered gap in the cover.

FIG. 5A shows another embodiment of the present invention. The substrate 51 is composed of a radial fin region 52 representing the heat transfer region. This region is shown to be circular, but it can take any other shape, such as square, triangular, oval and like. A cover 53 is placed above the fin region 52 with a gap 54 between the top of the fin surface and the cover 53. The gap 54 has a negative taper in the radial direction. The taper may be continuous or in a step-wise fashion. The cover 53 is shown to be circular, but it can take any other shape, such as square, triangular, oval and like. Additional features are present to contain and direct the fluid flow from inlet 55 to outlet 57 in the desired fashion. The cover and the fin region may be of the same size and shape, or may be of different size or shape.

Figure 5B:
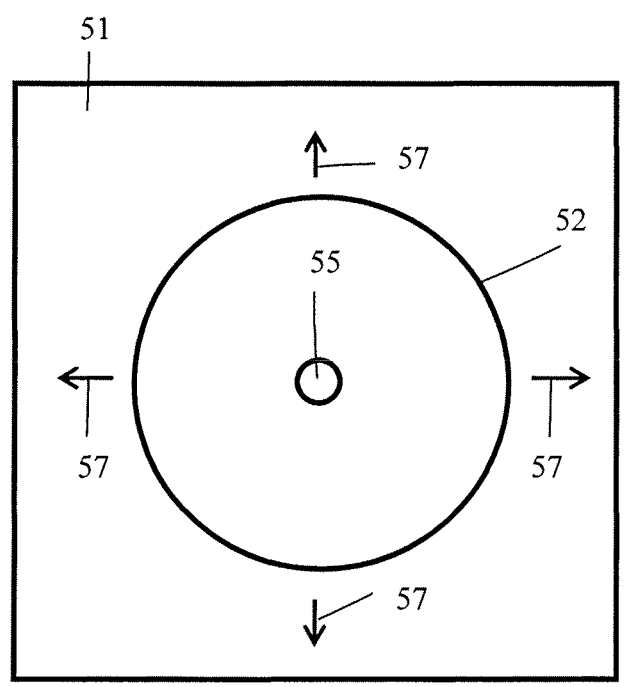

FIG. 5B shows a top view of the microchannel chip alone. The radial fin region 52 is also shown. The fin region 52 may be composed of radial open microchannels, with varying channel widths, or with varying fin widths, or a combination of the two. Alternatively, the fin region may contain other enhancement features such as pin fins, offset strip fins, turbulators, structured roughness elements, microchannels, and like, or combinations of some of these elements. The taper in the cover is designed to provide the desired performance in association with the varying flow field cross-sectional area in the flow direction within the fin region from inlet 55 to outlet 57. The orientation of the enhancement features may be along the flow direction or parallel to one of the edges, or at an angle to the edges or the flow direction, random, or a combination of any of these. The enhancement features may be of uniform density, or the density may vary.

Figure 6A:
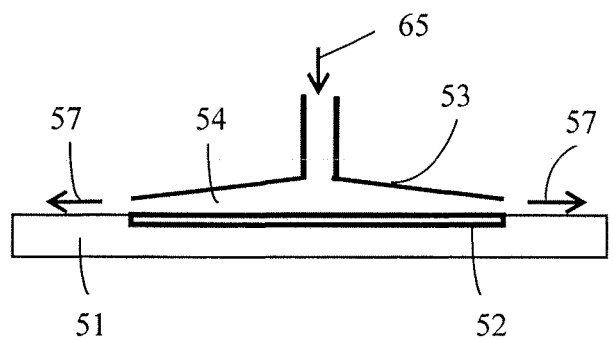
FIGS. 6A and 6B are schematics of an embodiment showing a rectangular fin region and cover with tapered gap and having rectangular fluid inlet and side outlet ports.

The inlet port 55 is shown in the center in FIGS. 5A and 6A. The inlet port may be located off-center, or at any other location. Multiple ports may be provided instead of a single port. The taper may be uniform, non-uniform or step-wise. The outlet 57 is shown to be uniform all around. It may be open only at certain specific locations. The inlet and outlet ports may be switched. The configuration may be used for single-phase, or two-phase, or combination, including flow boiling and flow condensation.

Figure 6B:
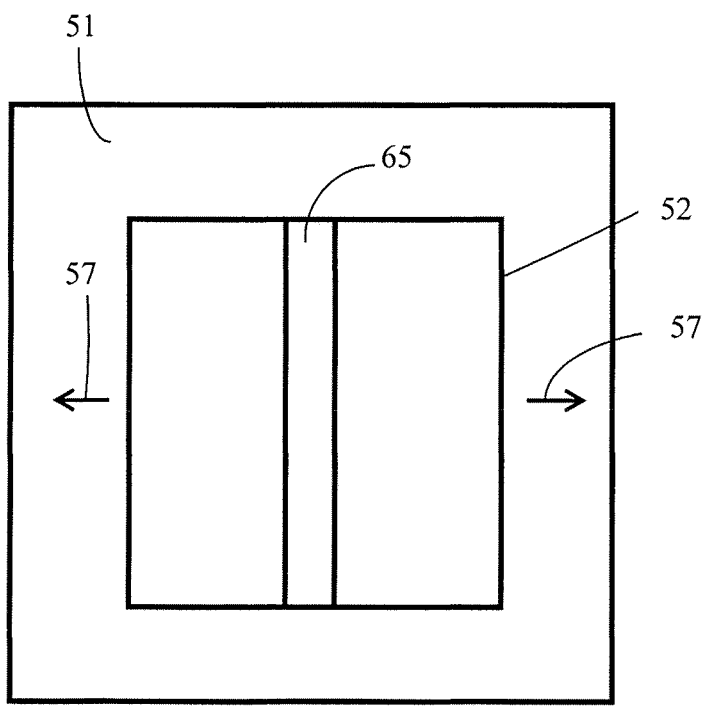

FIGS. 6A and 6B show another embodiment in which the inlet port 65 is rectangular and the fluid flows in the two opposite directions. The number of the ports, shape of the ports, and their locations can be same or different from those shown in these embodiments. The size and shape of the cover and the fin region may be the same or different from each other. These shapes can be other than those shown in these embodiments. In a further embodiment, the cover may include additional surface enhancement features, such as those noted above.

The invention can be used with single-phase fluid flow or two-phase fluid flow, or both in different regions, and includes flow boiling and flow condensation. Additional features may be incorporated to improve the heat transfer rate, reduce pressure drop, provide flow stability, remove or add one phase preferentially from or to the heat transfer system. Specific features are further elaborated in the description provided in the disclosure.

The invention will be further illustrated with reference to the following specific examples. It is understood that these examples are given by way of illustration and are not meant to limit the disclosure or the claims to follow.

Figure 7:
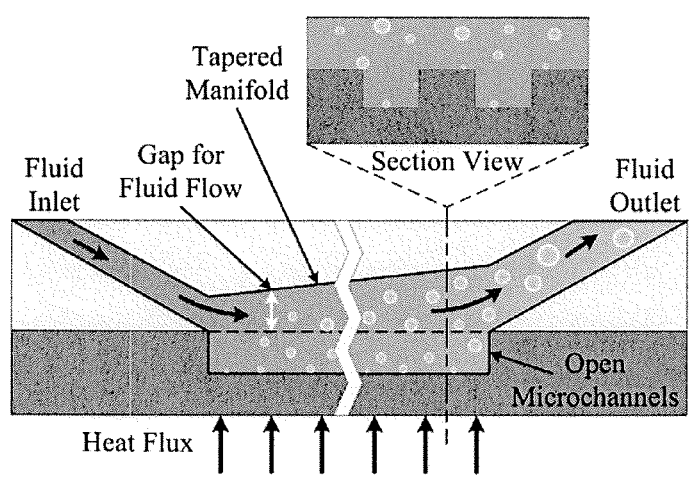
FIG. 7 is a schematic of the open microchannels with tapered gaps for stable, enhanced flow boiling.
Figure 8:
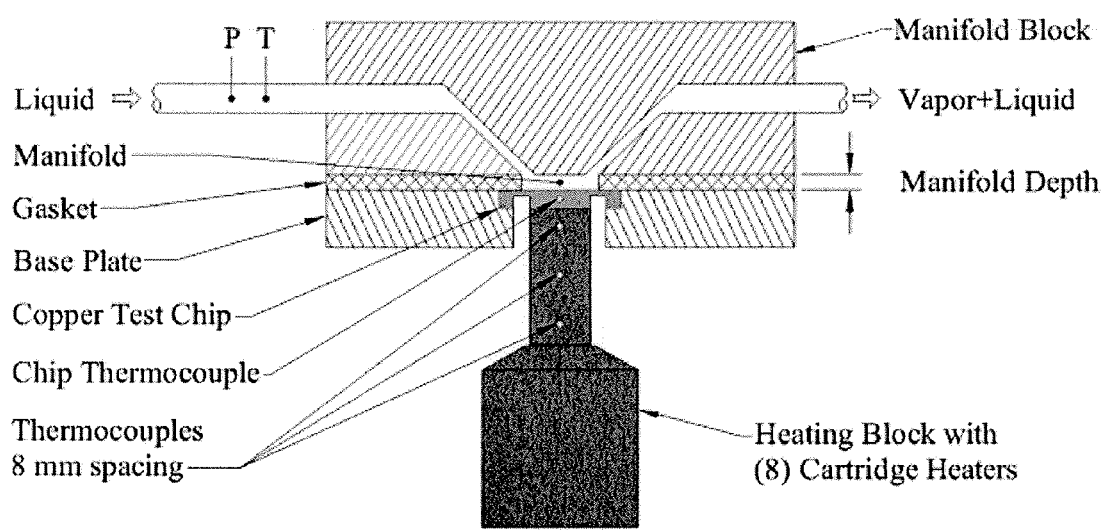
FIG. 8 is a schematic of the test section and the heater assembly used in the examples.

The flow boiling experiments were performed using the configuration shown in FIG. 7, which shows open microchannels with a tapered gap that provides larger flow area toward the outlet for stable, enhanced flow boiling. FIG. 8 shows a schematic of the test section and heater assembly used in the examples which is composed of a copper block with eight 200 W cartridge heaters to serve as the main heating unit. The tip of the square heating block measures 10 mm×10 mm and has three equally spaced K-type thermocouples that were used to determine the heat flux. A copper chip contacts the tip of the heating block, and a fourth thermocouple in the chip measures its temperature. The chip was supported by a ceramic plate, and a cover block delivers and removes water from the surface of the chip. A silicone gasket between the chip and the cover block was used to seal the system and provided the ability to readily vary the gap by changing the gasket thickness. The gaskets used during testing had thicknesses ranging from 0.127 mm to 1.524 mm. A Keyence VW-6000 camera with recording speeds of up to 24,000 frames per second (fps) was used for recording and observing flow boiling patterns, though most of the videos were recorded at 1000-2000 fps. A pump provided varying flow rates of distilled water to the test setup. A reservoir containing the water (not shown) was heated to saturation temperature with an electric hot plate. To overcome the heat losses in the supply line between the reservoir and the test section, an inline heater was installed and a subcooling of 2-5° C. was maintained at the inlet of the test section. The supply tubing, pump, and flow meter were wrapped in fiberglass insulation to minimize heat losses.

Prior to conducting tests, the gasket, test chip, cover block, and water flow rate were selected, and the heater was initialized at 35 V input (corresponding to a minimum heat flux of about 24 W/cm$^2$). Once the system achieved steady state (characterized by a negligible change in heat flux over a 10 minute period) the thermocouple temperatures and pressure drop readings were recorded. The heater voltage was then increased by 5 or 10 V, and the system was again allowed to reach a new steady state. For safety purposes this testing cycle continued only until the chip surface temperature approached 125° C., or the cartridge heater temperature reached 600° C. High-speed videos of the chip surface were taken at each set point for visualization of water flow and bubble dynamics. Following the completion of a test, the power supply to the heater was shut off so that the setup can cool down. The water flow rate was then adjusted to the next set point, and the tests were repeated. A maximum of five flow rates were tested during the experiments.

The heat flux to the chip was calculated by the Fourier's law for one dimensional heat conduction in the heater block:

$$q'' = -k_{Cu} \frac{dT}{dx}. \tag{1}$$

The thermal conductivity of the copper heater block is $k_{Cu}$. The temperature gradient $dT/dx$ was calculated from a three-point backward difference Taylor series approximation using the heating block temperatures, $T_1$, $T_2$ and $T_3$, each at a distance $\Delta x$ of 8 mm apart:

$$\frac{dT}{dx} = \frac{3T_1 - 4T_2 + T_3}{2\Delta x}. \tag{2}$$

Finally, the chip surface temperature was obtained from the measured chip temperature $T_4$, the heat flux, and the distance L=1.5 mm between the chip thermocouple and the chip surface.

$$T_s = T_4 - q'' \frac{L}{k_{Cu}}. \tag{3}$$

An uncertainty analysis was conducted, at the highest flow rate (333 mL/min) the rotameter had an uncertainty of 3%, and at the low flow rate the uncertainty was 5%. The individually calibrated thermocouples have an accuracy of 0.1° C. The resulting uncertainty in heat flux and surface temperature at high heat fluxes were 4% and 0.24° C., respectively. All heat fluxes are reported on the basis of the projected area of the boiling surface, which is 100 mm$^2$.

Figure 9:
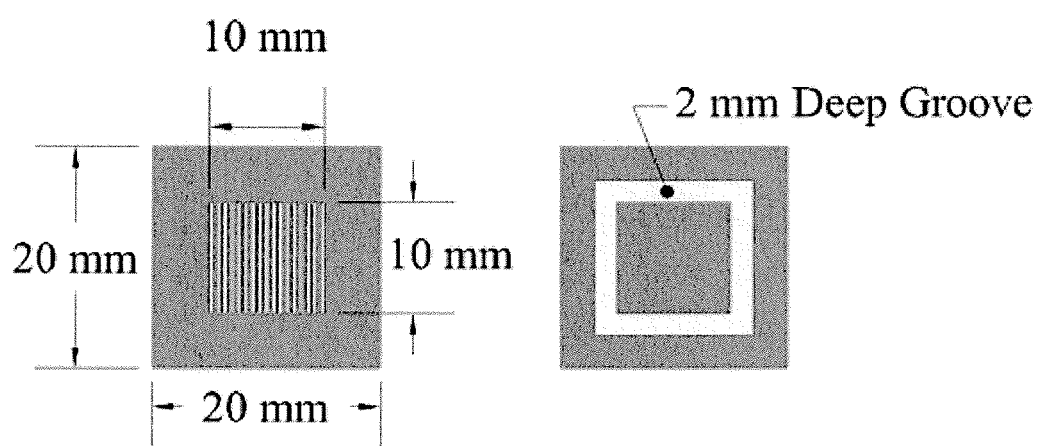
FIG. 9 is a schematic of a 3 mm thick copper chip with 217 μm wide, 162 μm deep, and 160 μm fin width in the central 10 mm×10 mm region (left image) and 2 mm wide×2 mm deep groove on the underside (right image)

Test Chips—Experiments were performed with two 3 mm thick copper chips: one with a plain surface, and the other with microchannels in the central 10 mm×10 mm heated region. The front and back views of the microchannel chip are shown in FIG. 9. The open microchannels were CNC milled and had a channel width of 217 μm, fin width of 160 μm, channel depth of 162 μm and length of 10 mm in the central 10 mm×10 mm region (left image) and 2 mm wide×2 mm deep groove on the underside (right image).

Specifically, a 2 mm wide and 2 mm deep groove was machined on the underside of the chip to reduce the heat losses and heat spreading effect from the chip.

The cover blocks were constructed out of Lexan® and polysulfone, and were polished to improve transparency for flow visualization with the high speed camera. Two types of cover blocks were employed: a positive tapered cover block, which provided a tapered gap above the microchannels and increased the gap depth by 0.180 mm from the inlet to the outlet, and a uniform cover with no taper which had a flat surface without any recess in the block. In both cases the depth was controlled by inserting a gasket of desired thickness between the chip and the cover block as shown in FIG. 8. Five gaskets of thicknesses 0.127 mm, 0.254 mm, 0.508 mm, 1.016 mm, and 1.524 mm were used to provide the desired gap depth over the microchannels.

The gaskets served a secondary purpose of limiting heat transfer to the microchannel region. A 10 mm×10 mm opening in each gasket was aligned over the 10 mm×10 mm microchannel region to inhibit contact between the working fluid and the outer edges of the test chip. The heat losses and the heat spreading effect from the test section were minimized due to the gasket and the groove on the underside as shown in FIG. 9. The errors in heat flux due to heat losses and heat spreading effects were estimated to be less than 1%. The active area of the chip was thus defined by the square opening in the gasket over the chip region with microchannel features. The microchannel flow length was 10 mm in all testing.

Nomenclature

As used throughout this application, the following symbols are meant to represent:
h heat transfer coefficient, W/m$^2$° C.
$k_{Cu}$ thermal conductivity of copper block, W/m° C.
L length from thermocouple to chip surface, mm
q" applied heat flux, W/cm$^2$
P pressure, Pa
volumetric flow rate, mL/min
S microchannel depth (gap), mm
T temperature, ° C.
x vapor quality
Greek symbols
$\Delta T_{sat}$ wall superheat, ° C.
$\Delta x$ distance between thermocouples, mm
Superscripts
s surface

EXAMPLES

The experimental results given below report the heat flux values, pressure drop, and heat transfer coefficients obtained in each of the following experiments.

Example 1

Figure 10:
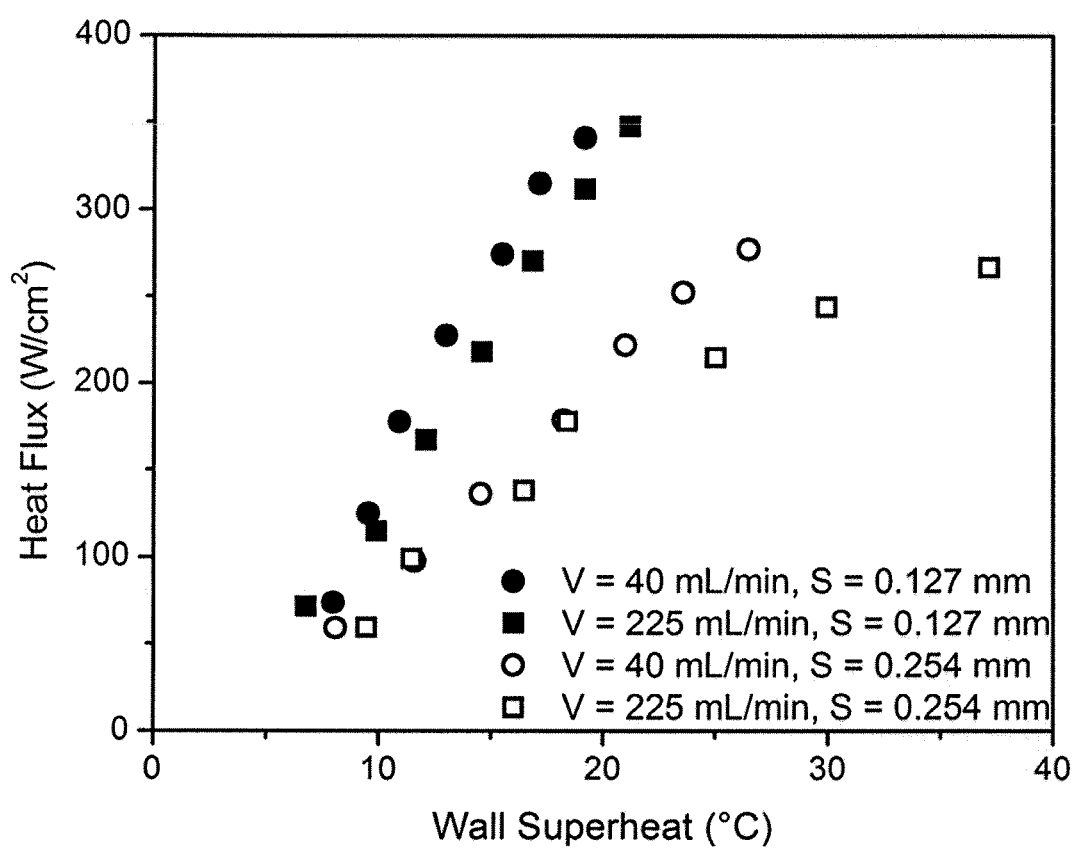
FIG. 10 is a graph of the heat transfer performance of Experiments A1 (V=40 mL/min, S=0.127 mm), A2 (V=225 mL/min, S=0.127 mm), B1 (V=40 mL/min, S=0.254 mm), B2 (V=225 mL/min, S=0.254 mm) with heat flux plotted vs. wall superheat described in Example 1.

This example is reported in a paper entitled "Experimental Investigation of Flow Boiling Performance of Open Microchannels with Uniform and Tapered Manifolds (OMM)" by Kandlikar, Wedger, Kalani and Mejia published in ASME Journal of Heat Transfer, Volume 135, June 2013, which is herein incorporated by reference in its entirety. A microchannel chip with a 10 mm×10 mm area was used as the boiling surface. The open microchannels were 162 µm (1 µm=0.001 mm) deep and 217 µm wide with 160 µm wide fins separating the open microchannels. Two different configurations A and B with different gap spacings S above the open microchannels at the inlet of (A) 127 µm and (B) 254 µm were tested. The taper, which represents the difference between the outlet gap and the inlet gap, was 180 µm for both gaps. The resulting gaps above the open microchannels at the outlet were thus (A) 127+180=307 µm and (B) 254+180=434 µm, respectively. The testing was performed with water as the fluid at two different flow rates V of (1) 40 mL/min (milliliters per minute) and (2) 225 mL/min. The resulting heat transfer performance is shown in FIG. 10 with heat flux on the projected heat transfer area of 10 mm×10 mm plotted as a function of wall superheat (which is the wall surface temperature minus the saturation temperature of the boiling liquid) for the two gaps and the two flow rates.

In all the experimental runs, the critical heat flux was not reached. Experiment A1 (V=40 mL/min, S=0.127 mm) a maximum heat flux of 350 W/cm$^2$ at a wall superheat of 19° C. was obtained with an inlet gap above the open microchannels of 127 µm at 40 mL/min. The resulting heat transfer coefficient (defined as the heat flux divided by the wall superheat) was 184,200 W/m$^2$° C. This performance is significantly above the heat transfer performance obtained with closed microchannels of similar dimensions and flow rates, for which literature indicates a maximum heat flux in the neighborhood of 130 W/cm$^2$ with a heat transfer coefficient of 20,000 to 80,000 W/m$^2$° C. The reduction in pressure drop was similarly very significant. For prior art configurations using closed microchannels of similar dimensions and flow rates a pressure drop of 40-80 kPa at heat fluxes of less than 130 W/cm$^2$ has been reported in the literature. For Experiment A1, the flow was found to be stable with no back flow seen during high speed visualization through a transparent cover. In Experiments A1 (V=40 mL/min, S=0.127 mm), A2 (V=225 mL/min, S=0.127 mm), B1 (V=40 mL/min, S=0.254 mm), B2 (V=225 mL/min, S=0.254 mm), the critical heat flux was not reached indicating potential for higher heat flux dissipation with the tapered open microchannel configuration of the present invention. These results indicate significant improvement in all three parameters with higher maximum heat flux dissipated, higher heat transfer coefficient and lower pressure drop as compared to the boiling systems reported in the literature.

Example 2

These tests were performed on two chips—a plain chip without any microchannels and a microchannel chip similar to that used in Example 1 except with microchannels 450 µm deep and 181 µm wide, and with 195 µm wide fins separating the microchannels. The projected surface area of the heated chip over which boiling occurred was the same in all three examples, i.e., 10 mm×10 mm.

Experiment U2 had a uniform gap of 127 µm over the entire chip area from inlet to outlet. Three different tapered gaps of 127 µm at the inlet and 327 µm, 527 µm and 727 µm at the outlet (127 µm gap plus 200 µm, 400 µm and 600 µm taper, respectively) were used, as represented by C1, C2, and C3, respectively each with gradually increasing gap on the exit side. The mass flux for the testing was kept constant at 1050 kg/m$^2$ s based on the flow area at the inlet for all the experiments in Example 2.

Figure 11:
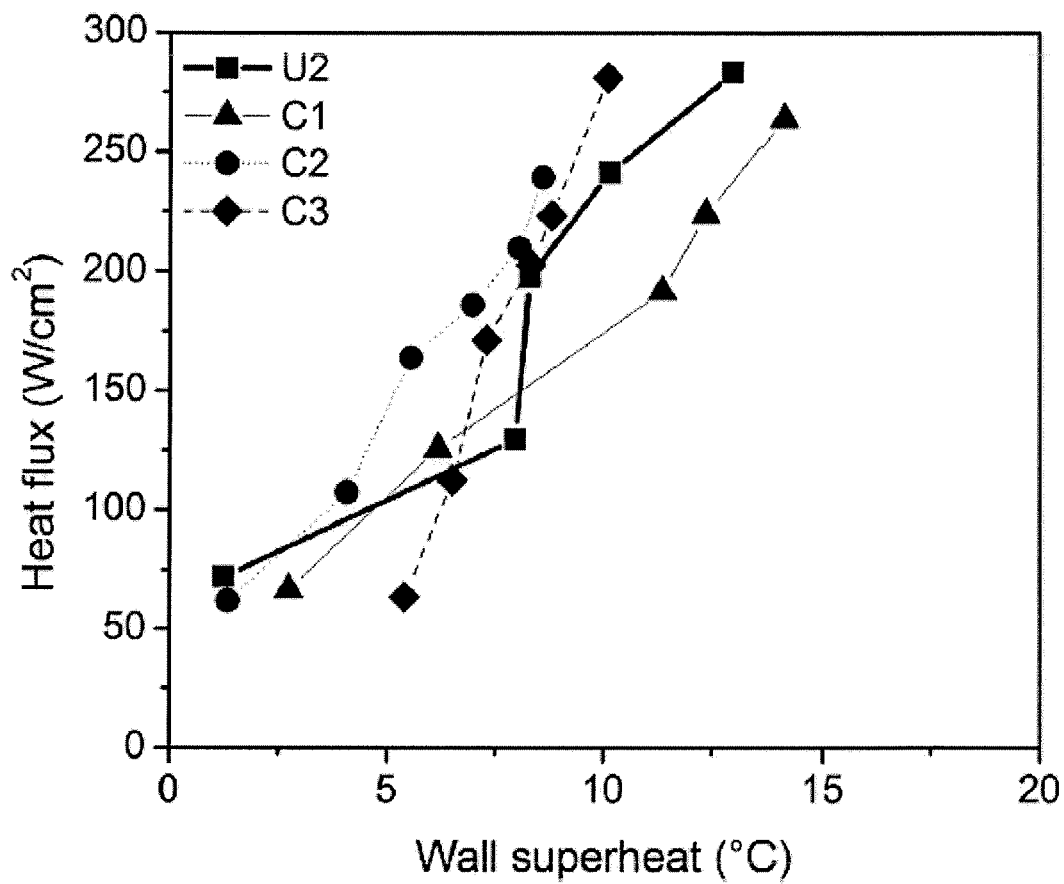
FIG. 11 is a graph of the flow boiling performance of the microchannel chip with uniform and the three tapered gaps C1, C2, and C3 in Example 2.
Figure 12:
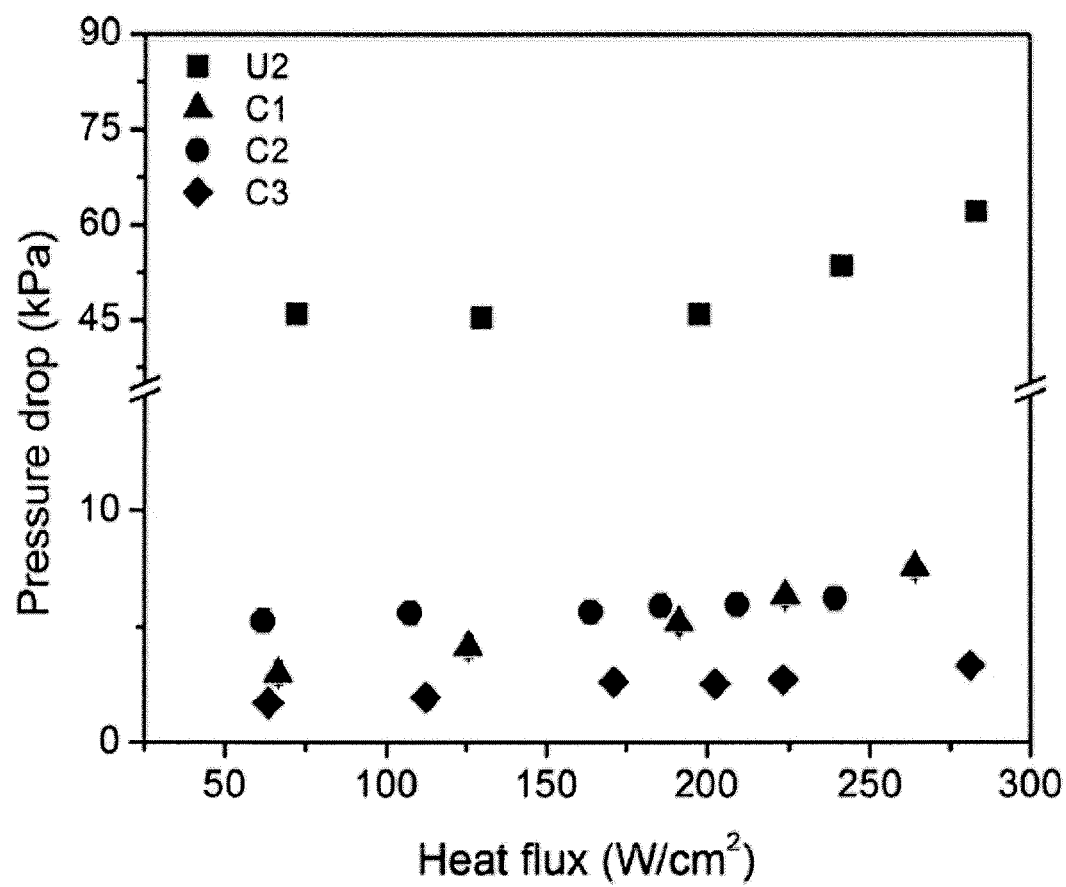
FIG. 12 is a graph of the pressure drop performance of microchannel chip with uniform gap U2 and tapered gaps C1, C2 and C3 in Example 2.

FIG. 11 shows the heat transfer performance comparison of the uniform gap of U2 and the three taper configurations of C1, C2, and C3. The taper C3 configuration provided the best performance in this group with a heat flux of 281.2 W/cm$^2$ at a wall superheat of 10.1° C. The resulting heat transfer coefficient was 278,400 W/m$^2$° C., which is higher than any value reported for flow boiling in closed microchannels in the literature. In addition C3 provided the best pressure drop performance in this group. FIG. 12 shows pressure drop comparisons for these four configurations. It is seen that all tapered configurations performed significantly better than the uniform gap configuration. A pressure drop of only 3.3 kPa was obtained with taper C3. The CHF was not reached in any of the tests shown in FIGS. 11 and 12. This combination of high heat flux dissipation, high heat transfer coefficient, and low pressure drop shows the unexpected behavior for configurations employed in these tests.

Example 3

The third example describes the performance of a microchannel chip of the same overall projected heating surface area of 10 mm×10 mm as in Examples 1 and 2. The microchannel chip had microchannels which were 250 µm deep with a channel width of 205 µm and a fin width of 145 µm. The taper was 340 µm with an inlet gap of 180 µm at the inlet resulting in an outlet gap of 520 µm.

Figure 13:
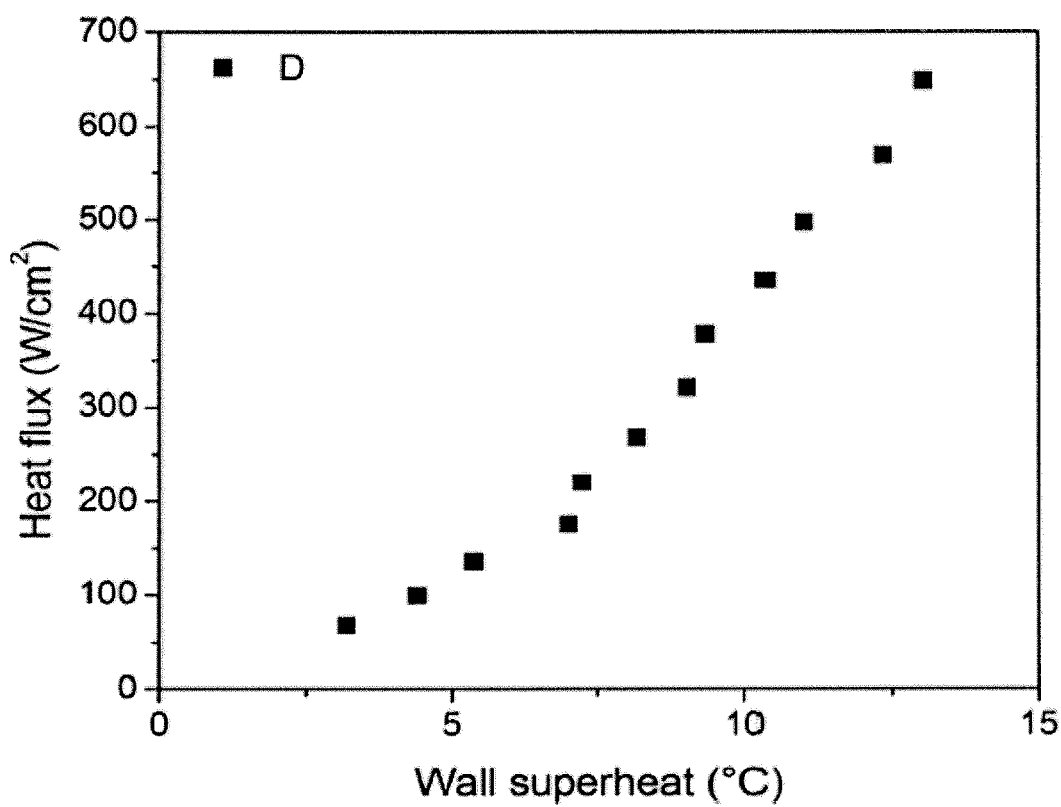
FIG. 13 is a graph of the flow boiling performance of the microchannel chip with a tapered gap D described in Example 3 with a maximum heat flux (CHF) of 648.5 W/cm2 at a wall superheat of 13.04° C. with a record heat transfer coefficient of 497,300 W/m2° C.
Figure 14:
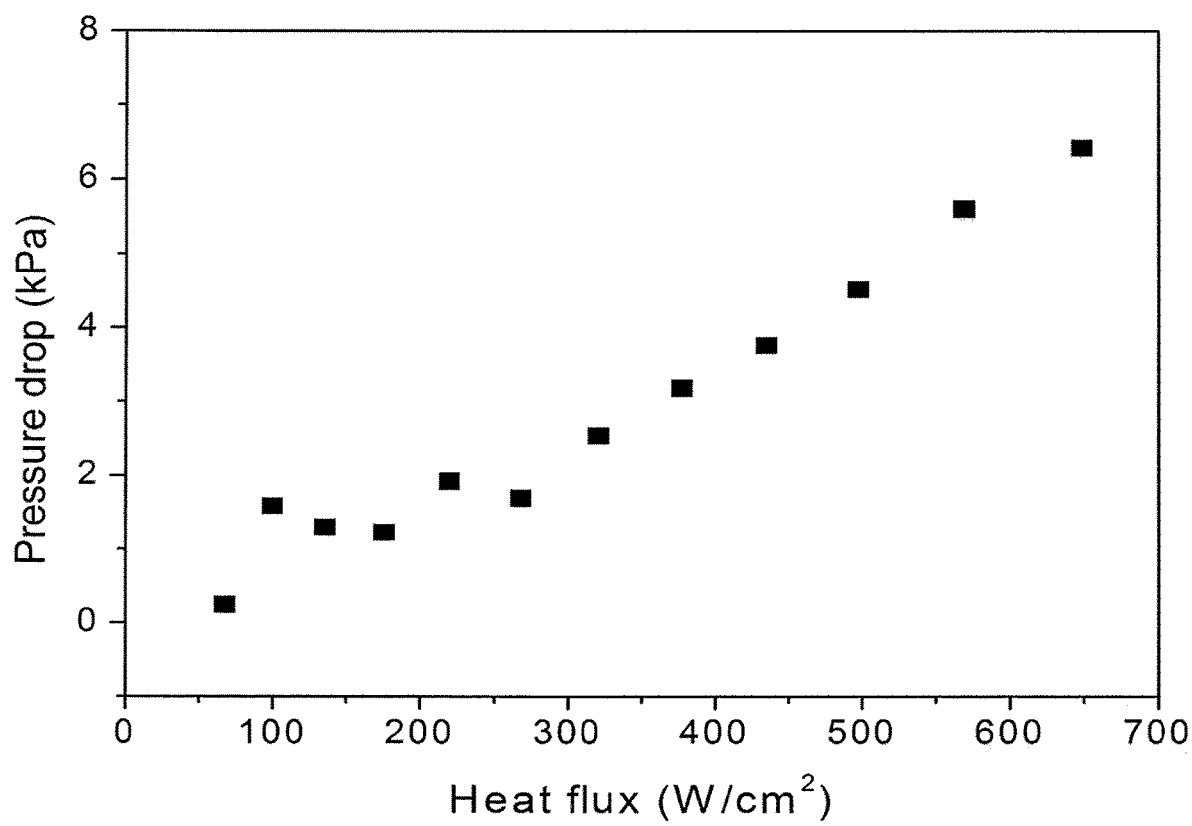
FIG. 14 is a graph of the pressure drop performance of the microchannel chip with tapered gap D described in Example 3 with a pressure drop of 6.41 kPa at the maximum heat flux of 648.5 W/cm2.

FIG. 13 shows the flow boiling performance of experiment D with a water flow rate of 80 mL/min. This configuration provided a heat flux of 648.5 W/cm$^2$ at a wall superheat of 13.04° C., resulting in a heat transfer coefficient of 497,300 W/m$^2$° C., which is a record for any comparative flow boiling systems reported in literature. The corresponding pressure drop plot is shown in FIG. 14, indicating at the highest flux, the resulting pressure drop was 6.41 kPa.

Although various embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed is:

1. A flow boiling heat transfer system comprising:
   a fluid inlet;
   a fluid outlet;
   a substrate having a fluid contacting side and a heat flux contacting side, through which heat is transferred across from the heat flux contacting side to the fluid contacting side;
   a plurality of enhancement features from about 1 micron to about 3 mm in height on a surface of the fluid contacting side of the substrate;
   a heat transfer region comprising the surface of the fluid contacting side of the substrate and the plurality of enhancement features;
   and
   a cover enclosing a mixed flow field,
   wherein the mixed flow field comprises an open region throughout the mixed flow field and the heat transfer region, the open region extending the entire length of the heat transfer region from the fluid inlet to the fluid outlet and bounded by the heat transfer region and the cover,
   and wherein a flow field cross-sectional area increases in a fluid flow direction by increasing the height of the open region in a direction normal to the substrate which reduces the acceleration pressure drop as well as total pressure drop and enhances critical heat flux and heat transfer coefficient during boiling of a fluid flowing through the mixed flow field.

2. The system of claim 1, further comprising a fluid source in communication with the fluid inlet.

3. The system of claim 1, wherein the plurality of enhancement features comprise at least one of micro fins and microchannels.

4. The system of claim 1, wherein the plurality of enhancement features is comprised of a plurality of open channels.

5. The system of claim 1, wherein the flow field cross-sectional area comprises a ratio of the maximum fluid flow cross-sectional area to the minimum fluid flow field cross-sectional area in a range of from 1.0001 to 1000.

6. The system of claim 5, wherein the range is from 1.001 to 100.

* * * * *